(12) United States Patent
Acharya

(10) Patent No.: US 7,888,706 B2
(45) Date of Patent: Feb. 15, 2011

(54) HIGH-EFFICIENCY FILLER CELL WITH SWITCHABLE, INTEGRATED BUFFER CAPACITANCE FOR HIGH FREQUENCY APPLICATIONS

(75) Inventor: Pramod Acharya, München (DE)

(73) Assignee: Infineon Technologies AG, Munich (DE)

( * ) Notice: Subject to any disclaimer, the term of this patent is extended or adjusted under 35 U.S.C. 154(b) by 652 days.

(21) Appl. No.: 11/444,128

(22) Filed: May 31, 2006

(65) Prior Publication Data
US 2007/0278525 A1    Dec. 6, 2007

(51) Int. Cl.
*H01L 27/10* (2006.01)

(52) U.S. Cl. ............... 257/206; 257/204; 257/E27.108; 438/199

(58) Field of Classification Search .................. 257/204, 257/206, E27.046, E27.108, E21.632; 438/199
See application file for complete search history.

(56) References Cited

U.S. PATENT DOCUMENTS

| | | | |
|---|---|---|---|
| 5,311,145 A * | 5/1994 | Huijsing et al. | 330/255 |
| 5,895,975 A * | 4/1999 | Lin | 257/758 |
| 6,594,809 B2 * | 7/2003 | Wang et al. | 716/10 |
| 6,639,430 B2 * | 10/2003 | Bult et al. | 327/57 |

* cited by examiner

*Primary Examiner*—Kiesha R Bryant
*Assistant Examiner*—Tucker Wright
(74) *Attorney, Agent, or Firm*—Brinks Hofer Gilson & Lione (57) ABSTRACT

A cell based integrated circuit chip includes a top voltage supply rail and a bottom voltage supply rail and a plurality of metal layers defining at least one filler cell. The filler cell is formed by a first field effect transistor of a first type conductivity, typically an n-channel MOSFET. The source or drain electrodes of the n-channel MOSFET are arranged to as act as a capacitor with respect to the bottom voltage supply rail and to which at least one of the source and drain electrodes is connected. A second field effect transistor of an opposite-type conductivity to the first field effect transistor, typically a p-channel MOSFET, is also provided. The source or drain electrodes of the p-channel MOSFET are connected in series between the top voltage supply rail and a gate electrode of the n-channel MOSFET. The gate electrode of the p-channel MOSFET is connected to a source of ground potential via a resistor.

13 Claims, 7 Drawing Sheets

HIGH-EFFICIENCY FILLER CELL WITH SWITCHABLE, INTEGRATED BUFFER CAPACITANCE FOR HIGH FREQUENCY APPLICATIONS

BACKGROUND

1. Technical Field

The invention relates to a cell layout arrangement. In particular, the invention relates to a cell layout arrangement with a filler cell for an integrated circuit chip.

2. Background Information

In cell based integrated circuit chips such as application specific integrated circuits (ASICs), FPGA and system-on-chip (SoC) designs, filler cells are used to provide separation between certain types of circuits and voltage biasing cells. In an SoC design, components traditionally manufactured as separate chips to be wired together on a printed circuit board are designed to occupy a single chip that contains memory, microprocessor(s), peripheral interfaces, input/output (I/O) logic control, data converters, and other components that together compose the whole electronic system. One stage during the design of such IC's is "Place and Route". During the 'Place and Route' stage a placement tool optimizes the location of circuits on a die to meet the timing requirements set by the product designer while conforming to placement restrictions to satisfy requirements of the technology, as well as legal placement locations. The placement tool places the circuits optimally to provide adequate space for wiring while the routing tool provides an electrically correct and uncongested distribution of interconnect wiring while meeting the timing requirements. Design Rule Checking (DRC) is carried out during system design to determine whether a particular chip design satisfies a series of recommended parameters called "Design Rules." Design Rules are a series of parameters provided by semiconductor manufacturers that enable a designer to verify the correctness of the system design. The rules are specific to a particular semiconductor manufacturing process and a design rule set specifies certain geometric and connectivity restrictions to ensure sufficient margins to account for variability in semiconductor manufacturing processes so as to ensure most of the parts work correctly.

The filler cells are normally "empty" (i.e. devoid of active devices) and are used not only to avoid DRC violations during 'Place and Route' but also to reduce routing congestion. They may contain metal layers up to the M2 layer only. However, the "empty" layout is often inlaid with local capacitors, normally n-channel or p-channel devices configured as two terminal devices, that act as energy wells and minimize supply bounce due to switching activity, especially in high frequency applications.

When used for these purposes, the capacitor of a filler cell must satisfy the following requirements: electrostatic discharge (ESD) and Gate Oxide Integrity (GOI) robustness; minimum usage of routing resources to connect the capacitor device; layout compactness to fit the capacitor device within predefined dimensions; minimal series resistance for use in HF applications; reasonable capacitance per square micron ($\mu m^2$); and no extra processing mask.

Several variants of such buffer capacitors that meet all or some of the conditions listed above have been proposed and implemented, for example: N-channel (p-channel) gate capacitance but this fails condition 1 and 2; or well diode capacitance but this fails conditions 4 and 5.

In addition to the foregoing, the shrinking gate oxide thickness now occurring as a result of advancing technology prevents direct connection of the gate to the VDD and/or VSS power rails owing to ESD considerations.

BRIEF SUMMARY

A high efficiency filler cell includes a switchable, integrated buffer capacitance. The filler cell may be particularly suitable for high frequency applications. A cell based integrated circuit chip includes a top voltage supply rail and a bottom voltage supply rail and a plurality of metal layers defining at least one filler cell. The filler cell is formed by a first field effect transistor of a first type conductivity, typically an n-channel MOSFET. The source or drain electrodes of the n-channel MOSFET are arranged to act as a capacitor with respect to the bottom voltage supply rail and to which at least one of the source and drain electrodes is connected. A second field effect transistor of an opposite-type conductivity to the first field effect transistor, typically an p-channel MOSFET, is also provided. The source or drain electrodes of the p-channel MOSFET are connected in series between the top voltage supply rail and a gate electrode of the n-channel MOSFET. The gate electrode of the p-channel MOSFET is connected to a source of ground potential via a resistor.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Because a designer or tool will use many filler cells in a particular design, it is very important that the filler cell with additional functionality included is not only designed, but also physically realized as efficiently as possible. In this regard, it should be mentioned that e.g. a filler cell which allows 8 equally spaced vertical metal interconnects through it, only uses 2 of these interconnects for realizing a buffer capacitor connection, which results in an efficiency of 75%.

Figure 1:
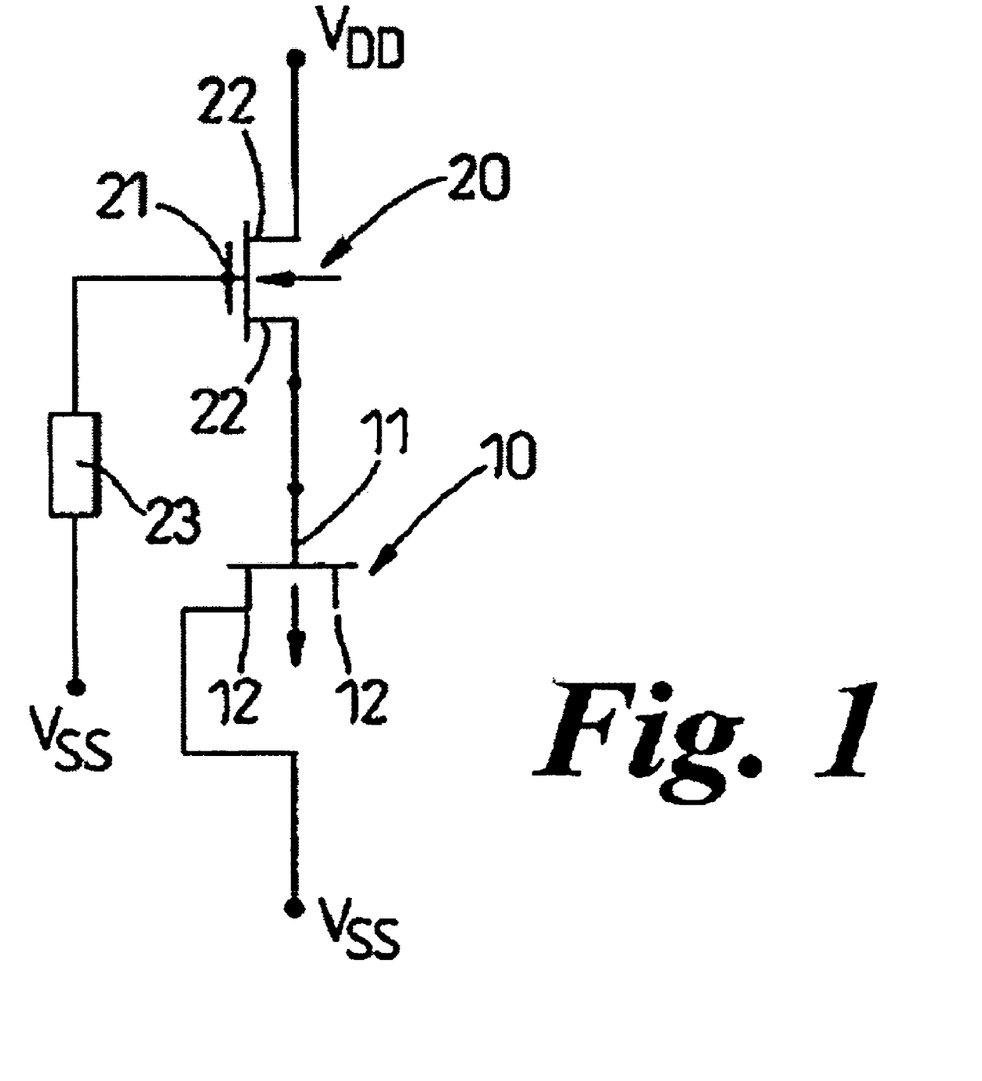
FIG. 1 shows an electrical circuit equivalent of a filler cell for incorporation in a semiconductor chip.
Figure 2:
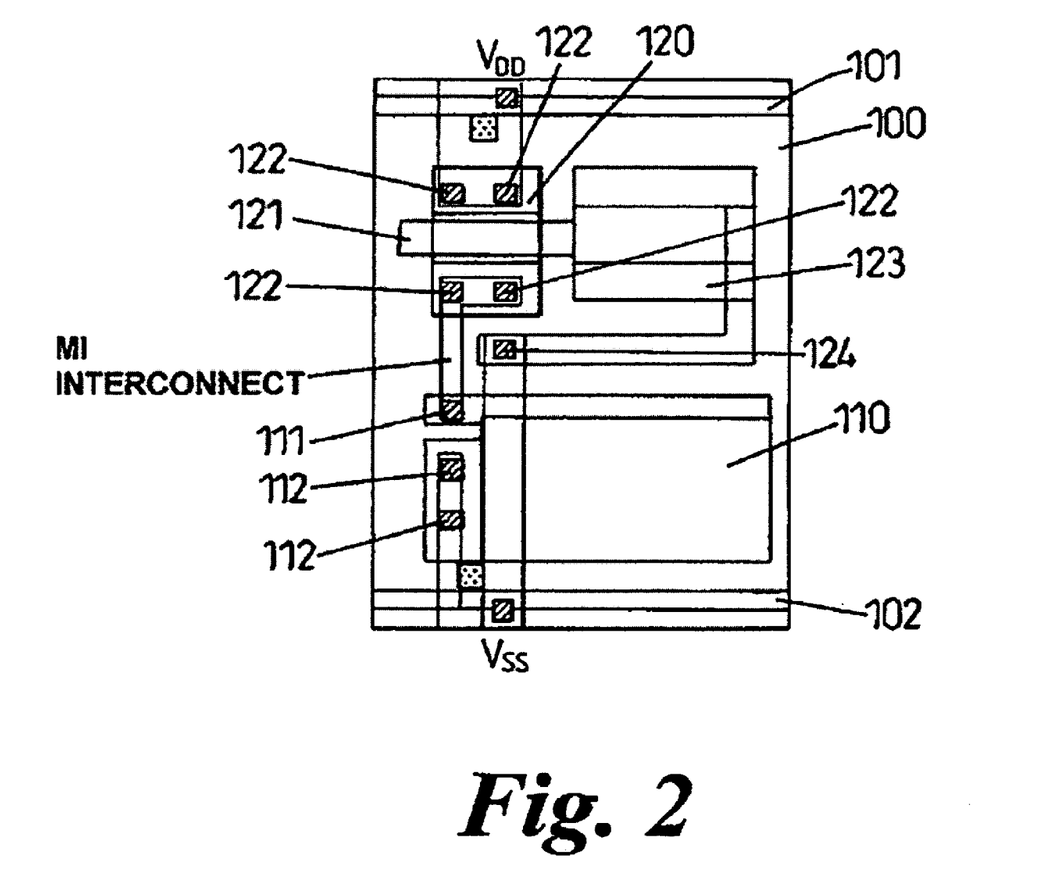
FIG. 2 is a layout equivalent of the circuit shown in FIG. 1.
Figure 3:
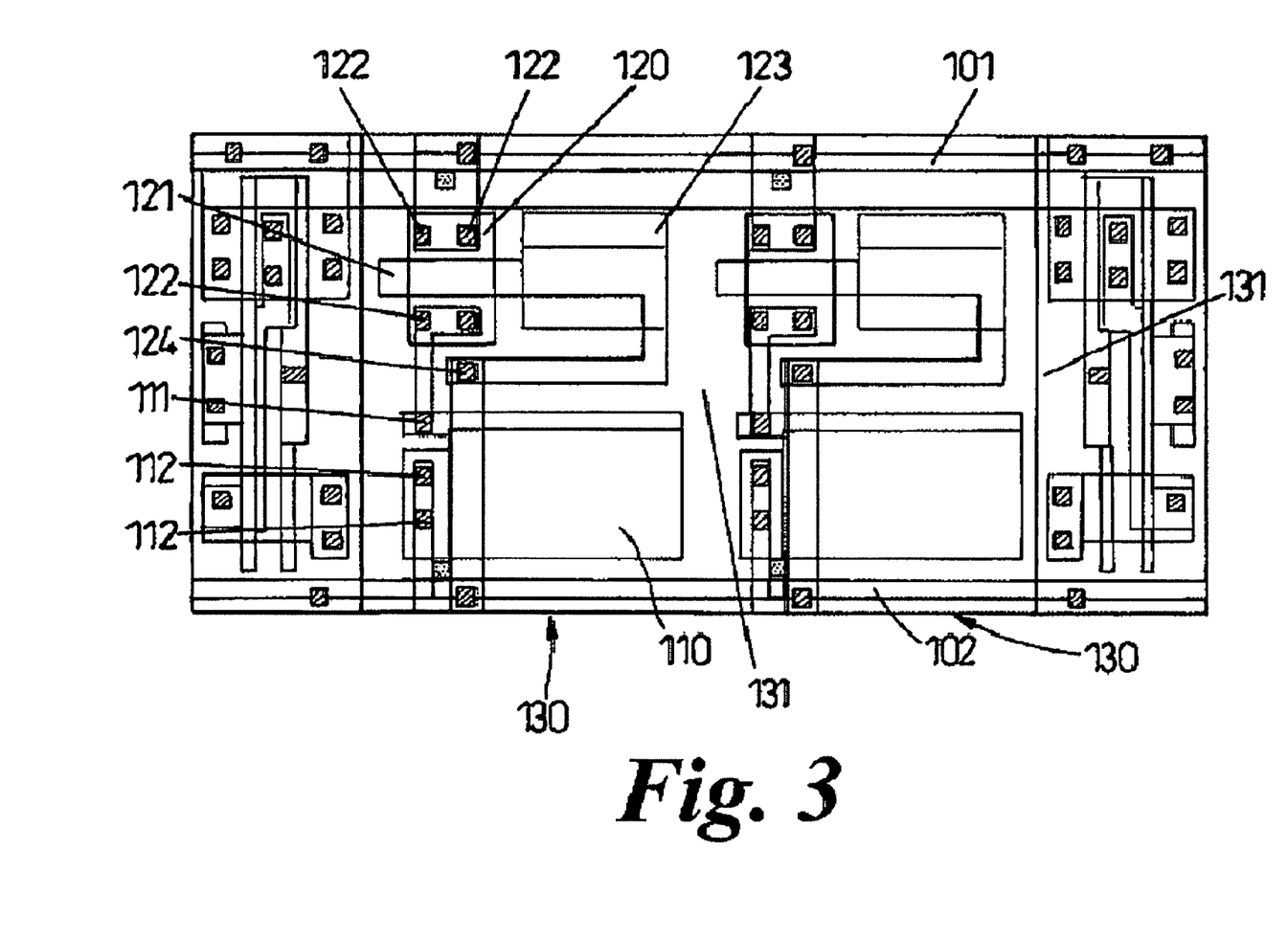
FIG. 3 shows part of a cell based chip floorplan illustrating two of the filler cells shown in FIG. 2 in a side-by-side arrangement.

FIGS. 1, 2 and 3 illustrate a first example filler cell for incorporation in a cell based semiconductor chip. With reference to FIG. 1, in an electrical circuit equivalent top and bottom voltage supply rails of the chip are shown as the output and lower-voltage sources VDD and VSS respectively. A first field effect transistor 10 comprises an n-channel MOSFET (NMOS) with a gate electrode 11 and source-drain electrodes 12. The source-drain electrodes 12 are arranged as act as a capacitor with respect to the lower-voltage supply source VSS. While both of the source-drain electrodes 12 can be connected to the lower-voltage source VSS, the n-channel connection can also be made by connecting only one of the source-drain electrodes 12 to the source VSS. This arrangement uses fewer interconnect resources and may provide a better choice. The gate electrode 11 is connected in series with a second field effect transistor 20. This second field effect transistor comprises a p-channel MOSFET (PMOS) with a gate electrode 21 and source-drain electrodes 22. The source-drain electrodes 22 are connected in series between the gate electrode 11 of the n-channel MOSFET 10 and the top, output voltage source VDD. The gate electrode 21 is connected to ground potential, namely the lower-voltage source VSS via a series resistance 23.

Both the NMOS 10 and the PMOS 20 comprise long channel, thin oxide MOSFETs. In such an n-MOSFET, if only a supply voltage is applied across it, as in the present arrangement, then the energy supplied by the MOSFET is proportional to the gate-source voltage reduced by a threshold voltage that is dependent on the geometrical shape and physical properties, especially the capacitance, of the MOSFET's thin oxide channel. The gate electrode 21 is grounded via a resistive non-silicided polysilicon layer 23 applied in its construction, which is represented as a resistor in FIG. 1 and through which it is connected to the lower-voltage source VSS. This layer 23 protects the thin oxide p-channel of the PMOS 20 from ESD while still allowing full p-channel operation.

A method of manufacturing the filler cell of FIG. 1 is shown in the layout depicted in FIG. 2. Here, a base portion 100 of the chip includes top and bottom voltage supply rails, 101 and 102 respectively, comprising output and lower-voltage sources VDD and VSS respectively. The filler cell itself is severely restricted in the layers forming NMOS circuitry 110, with a gate electrode contact 111 and source-drain electrode contacts 112, and PMOS circuitry 120, with a gate electrode 121 and source-drain electrode contacts 122. As described above the n-channel circuitry 110 has its gate contact 111 connected to a source-drain contact 122 of the PMOS circuitry 120. The source-drain contacts 112 are connected to the bottom voltage supply rail 102 via a first metal layer, the M1 layer, of the chip. The PMOS circuitry 120 has its other source-drain contact 122 connected to the top voltage supply rail 101. The PMOS circuitry 120 is also provided with a resistive non-silicided polysilicon layer 123 via which its gate electrode 121 is connected to the bottom voltage supply rail 102 via contact 124.

It will be appreciated that the layout is compact as only the first metal layer, the M1 layer, is used as the interconnect layer. Also, silicided polysilicon forming the source-drain contacts 112 are also in the M1 layer.

Figure 7:
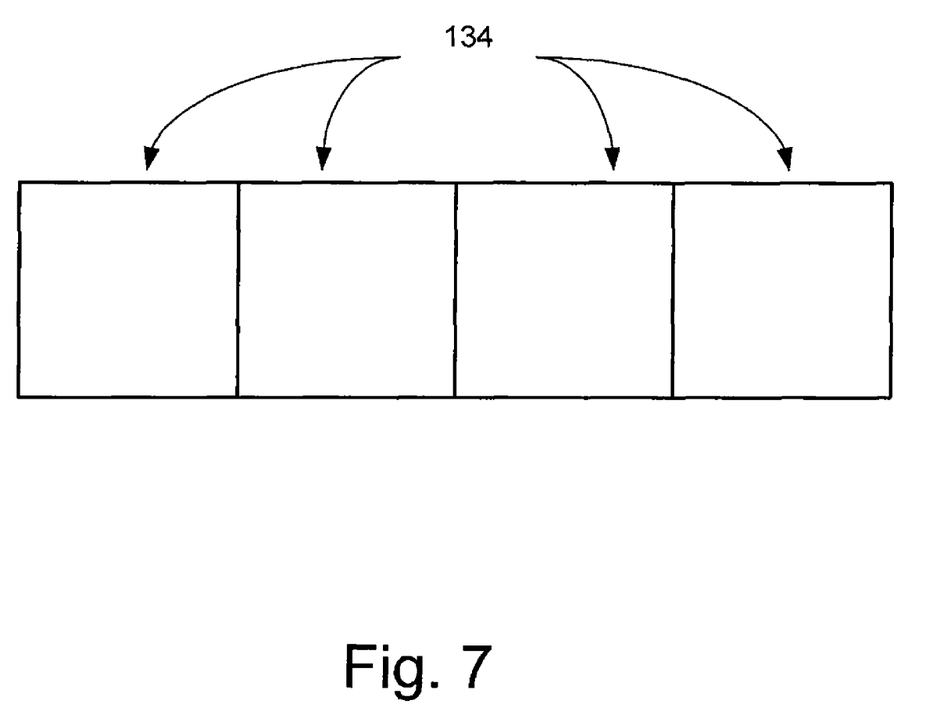
FIG. 7 shows an exemplary chip layout including a plurality of cells in which filler cells may fit.

Two filler cells 130 as shown in FIG. 2 are depicted in a side-by-side arrangement as part of a cell based chip floorplan in FIG. 3. Here, place and route boundaries (PR boundaries) 131 are illustrated between the various cells of the floorplan. In addition, FIG. 7 shows an exemplary chip layout including a plurality of cells 134 in which multiple filler cells, such as a plurality of the filler cells 130, may be arranged consistent with the side-by-side arrangement of FIG. 3.

Figure 4:
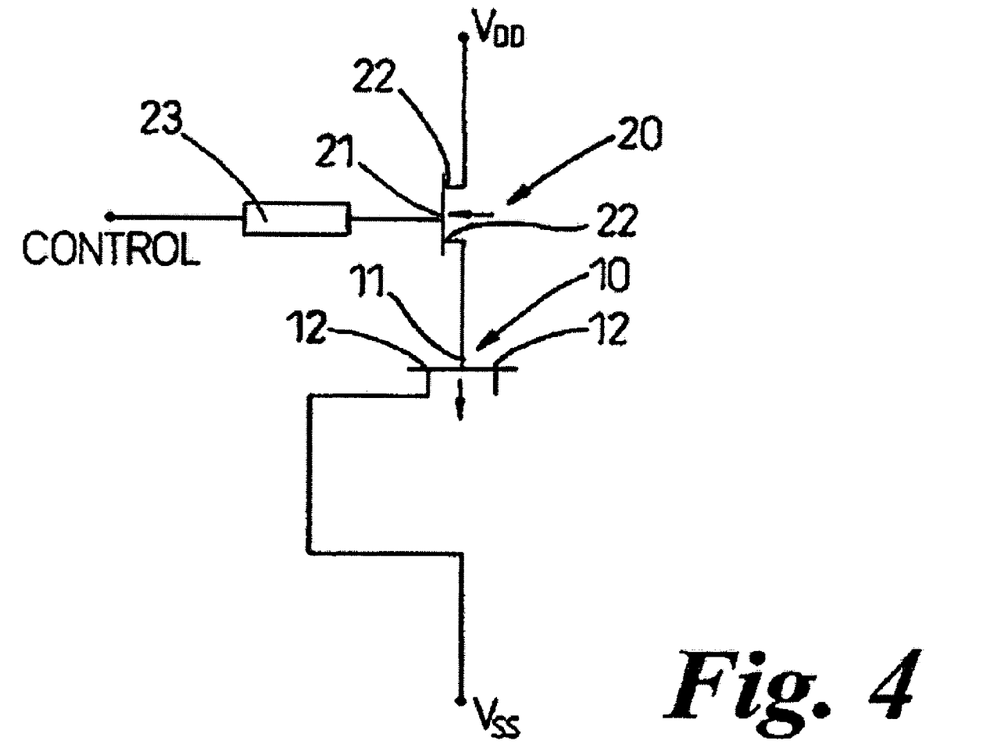
FIG. 4 shows an electrical circuit equivalent of a filler cell for incorporation in a cell based semiconductor chip.
Figure 5:
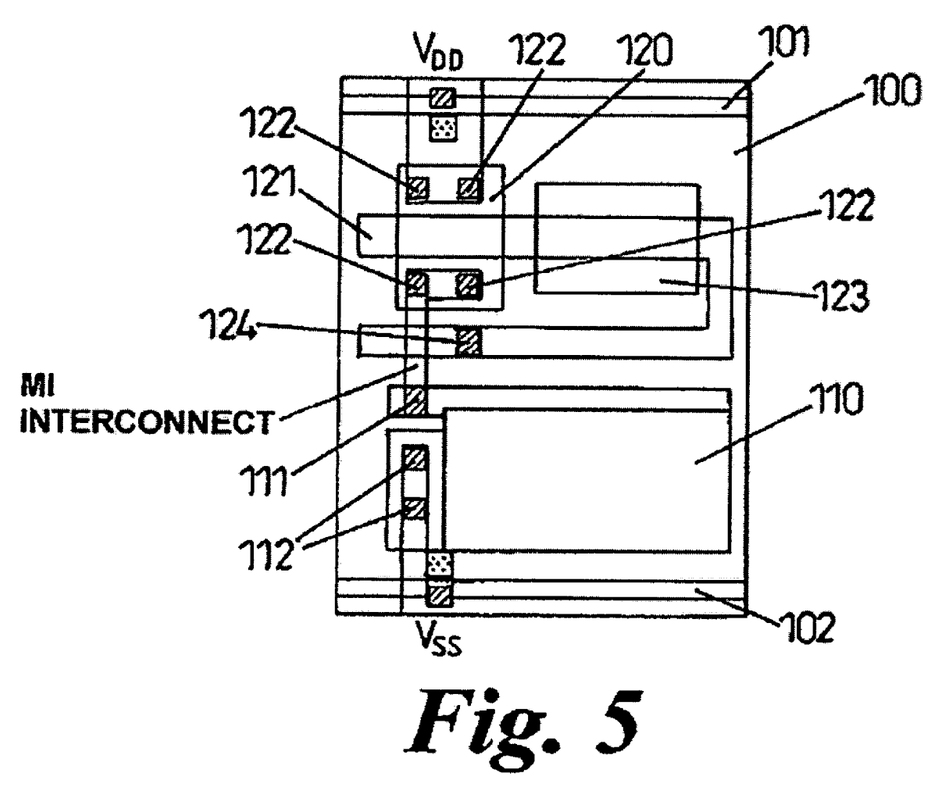
FIG. 5 is a layout equivalent of the circuit shown in FIG. 4.
Figure 6:
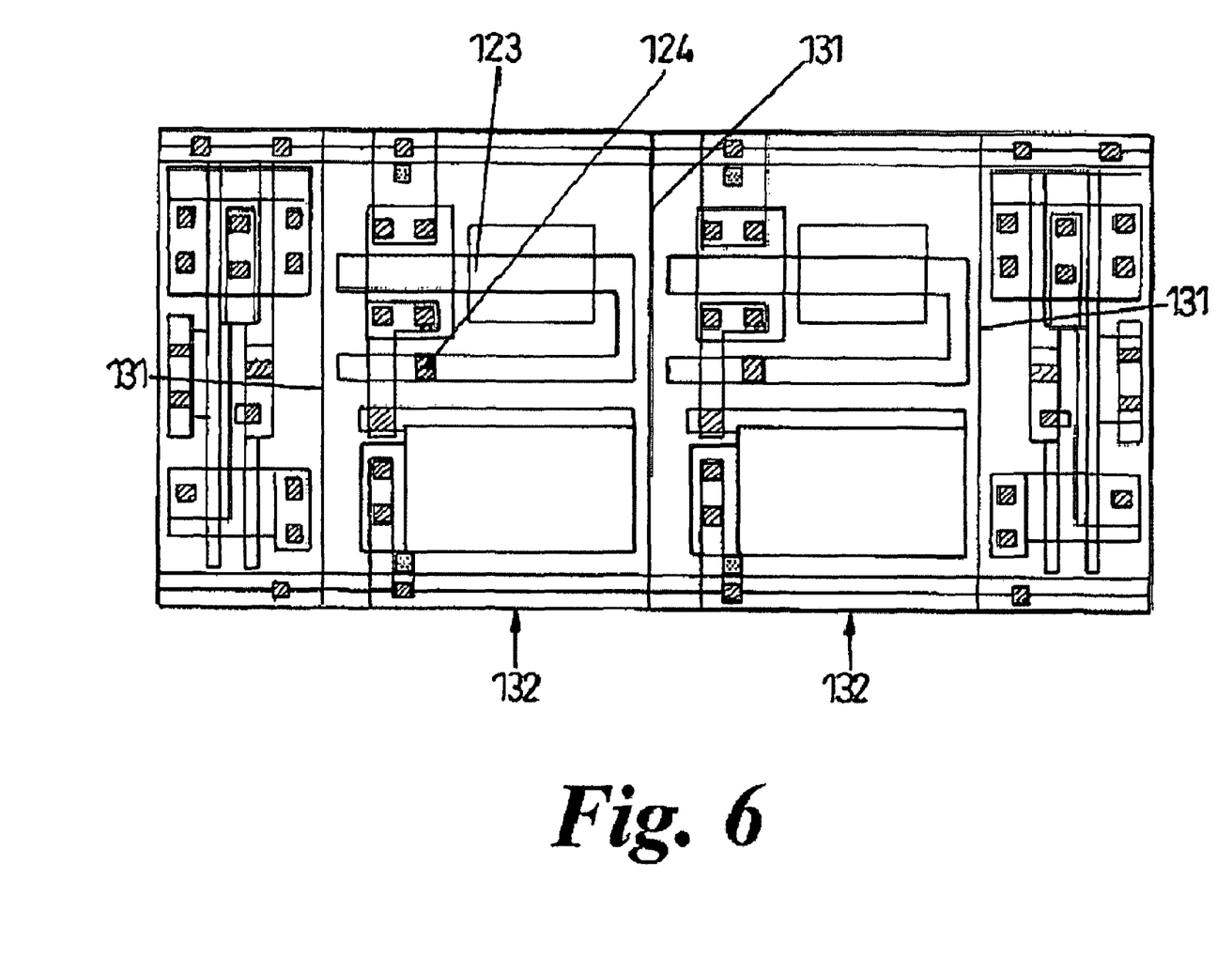
FIG. 6 shows part of a cell based chip floorplan illustrating the filler cell.

FIGS. 4, 5 and 6 illustrate a second example filler cell

With reference to FIG. 4, it can be seen that the electrical circuit equivalent is very similar to that shown in FIG. 1. However, here instead of the gate electrode 21 of the PMOS 20 being grounded by connection to the lower-voltage source VSS, it is grounded by connection to a control signal 24, preferably via a buffer (not shown). This arrangement has the advantage that the energy can be controlled by switching on or off the buffer. This is especially useful in applications where leakage needs to be minimized during standby mode as the buffer can be switched off when not needed thus saving energy owing to thin oxide leakage in the filler caps.

A method of manufacturing the filler cell of FIG. 4 is shown in the layout depicted in FIG. 5. Essentially this layout is the same as that shown in FIG. 2 except that the gate electrode of the PMOS circuitry 120 is not connected to the bottom voltage supply rail 102 via a metal layer, for example the M1 layer, of the chip but has a contact 124 for connection to a digital or analog control signal. In this case the connection to the non-silicided polysilicon layer 123 of the PMOS gate electrode is formed in the higher interconnect layer of the chip. Two such filler cells 132 as shown in FIG. 5 are depicted in a side-by-side arrangement as part of a cell based chip floorplan in FIG. 6. As with the floorplan shown in FIG. 3, place and route boundaries (PR boundaries) 131 are illustrated between the various cells of the floorplan. In addition, FIG. 7 shows an exemplary chip layout including a plurality of cells 134 in which multiple filler cells, such as a plurality of the filler cells 132, may be arranged consistent with the side-by-side arrangement of FIG. 5.

It should be appreciated that, in use, in both systems described above, the PMOS 20 is designed to operate in the linear region whereas the NMOS 10 is designed to operate in the inversion region of MOSFET operation. Hence, the PMOS 20 operates like a resistor controlled by the gate voltage whereas the NMOS 10 operates as a capacitor. The filler cell therefore acts conceptually as an RC circuit wherein the voltage across the NMOS 20 increases as time passes, while the voltage across the PMOS source-drain 10 tends towards zero. The time constant ($\tau$) of this arrangement is therefore equal to the product of the resistance and the capacitance of the two components. The resistance of the PMOS 10 is determined by the voltage applied to its gate 12 which in turn controls the RC time constant. Hence, the filler cell will operate efficiently to take into account supply voltage transients.

When the PMOS 20 is operating as a resistor controlled by the gate voltage, the current between its source-drain electrodes 22 is directly proportional to the width of the gate and the inversely proportional to the length of the gate. Hence, it is possible to vary these parameters to alter the time constant ($\tau$) of the arrangement. As the susceptibility of the thin oxide gate layer to ESD breakdown is proportional to the length of the PMOS gate, then there is a trade off between the time constant and ESD vulnerability and a suitable compromise must be reached appropriate to the particular application.

It will be appreciated that while the description above has the NMOS 10 operating as a capacitor and the PMOS 20 operating as a resistor, the order of the devices can be switched so that the a PMOS is used as the capacitor and an NMOS is used as the resistor.

In conventional technologies, the oxide gate layer in both the NMOS and PMOS are made as thin as possible to increase the channel conductivity and performance when the NMOS and PMOS are on and to minimize subthreshold leakage when they are off. However, if the gate oxide layer is made too thin, for example with a thickness of around 1.2 nm, the phenomenon of tunneling leakage becomes dominant between the gate and the n- or p-channel, leading to increased standby energy consumption. This topology ensures a good compromise while balancing the above tradeoffs.

The disclosure therefore provides a high efficiency filler cell that has a switchable, integrated buffer capacitance. It is particularly suitable for high frequency applications and the topology satisfies all six of the requirements mentioned above. The vulnerability of the p channel and n channel thin oxide layer to ESD breakdown is countered by the series-connected long p-channel MOSFET 20, and the oxidized/silicided poly which improves the ESD and GOI robustness. The layout is compact as only silicided polysilicon and M1 is used as a local interconnect. Also, as the salicided polysilicon and the M1 metal layer are used for the local interconnection, the series resistance is minimized. In addition, a high capacitance per square micron can be achieved and no extra mask is required to realize the topology of the cell. The filler cell has been designed for use in 90 nm channel length technology but the topology is scaleable and could be migrated to the newer 65 nm and below channel length technology.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. An integrated circuit chip with a top voltage supply rail and a bottom voltage supply rail, the integrated circuit chip comprising: a plurality of metal layers defining at least one filler cell, wherein a first field effect transistor of a first type conductivity is provided with a source electrode and a drain electrode arranged so as to act as a capacitor with respect to the bottom voltage supply rail to which one of the source electrode or the drain electrode is connected; and a second field effect transistor of an opposite-type conductivity to the first field effect transistor provided with a source electrode or a drain electrode, connected in series between the top voltage supply rail and a gate electrode of the first field effect transistor and with the second field effect transistor gate electrode connected to a ground potential, wherein the source or drain electrode of the first field effect transistor that is not connected to the bottom voltage supply rail is in an unconnected state.

2. An integrated circuit chip as claimed in claim 1, wherein the second field effect transistor gate electrode is grounded via a layer of non-silicided polysilicon.

3. An integrated circuit chip as claimed in claim 2, wherein the second field effect transistor gate electrode is connected to a control signal.

4. An integrated circuit chip as claimed in claim 2, wherein a first metal layer of the plurality of metal layers comprises an interconnect between the layer of non-silicided polysilicon and the bottom voltage supply rail.

5. An integrated circuit chip as claimed in claim 1, wherein a first metal layer of the plurality of layers is used to form an interconnection between the first field effect transistor and the second field effect transistor.

6. An integrated circuit chip as claimed in claim 1, wherein the first field effect transistor and the second field effect transistor comprise long channel MOSFETs.

7. A cell-based integrated circuit chip layout comprising a plurality of standard cells and a plurality of filler cells as defined in claim 1, wherein any of the filler cells fits within pre-defined standard cell dimensions.

8. An integrated circuit chip as claimed in claim 1, wherein neither of the source or drain electrodes of the first field effect transistor are coupled to the second field effect transistor.

9. An integrated circuit chip with a top voltage supply rail and a bottom voltage supply rail comprising: a plurality of metal layers defining at least one filler cell, wherein an n-channel MOSFET is provided with a source electrode and a drain electrode arranged to as act as a capacitor with respect to the bottom voltage supply rail to which one of the source electrode or the drain electrode is connected; and a p-channel MOSFET, provided with a source electrode or a drain electrode, connected in series between the top voltage supply rail and a gate electrode of the n-channel MOSFET and with the p-channel MOSFET gate electrode connected to a ground potential, wherein source or drain electrode of the n-channel MOSFET that is not connected to the bottom voltage supply rail is in an unconnected state.

10. An integrated circuit chip as claimed in claim 9, wherein the p-channel MOSFET gate electrode is grounded via a layer of non-silicided polysilicon.

11. An integrated circuit chip as claimed in claim 9, wherein the p-channel MOSFET gate electrode is grounded by connection to a control signal.

12. A cell-based integrated circuit chip layout comprising a plurality of standard cells and a plurality of filler cells as defined in claim 7, wherein any of the filler cells fits within pre-defined standard cell dimensions.

13. An integrated circuit chip as claimed in claim 9, wherein neither of the source or drain electrodes of the n-channel MOSFET are coupled to the p-channel MOSFET.

* * * * *